(12) United States Patent
Chaintreuil

(10) Patent No.: US 9,190,996 B2
(45) Date of Patent: Nov. 17, 2015

(54) PHOTOVOLTAIC DEVICE WITH ELECTRONIC SWITCH(ES)

(75) Inventor: Nicolas Chaintreuil, Montmelian (FR)

(73) Assignee: Commissariat a L'energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/501,416

(22) PCT Filed: Oct. 20, 2010

(86) PCT No.: PCT/EP2010/065762
§ 371 (c)(1),
(2), (4) Date: Apr. 11, 2012

(87) PCT Pub. No.: WO2011/048122
PCT Pub. Date: Apr. 28, 2011

(65) Prior Publication Data
US 2012/0200311 A1 Aug. 9, 2012

(30) Foreign Application Priority Data
Oct. 23, 2009 (FR) ..................................... 09 57450

(51) Int. Cl.
*G01R 31/26* (2014.01)
*H03K 17/687* (2006.01)
*H03K 17/16* (2006.01)
*H01L 31/02* (2006.01)
*H02S 50/10* (2014.01)

(52) U.S. Cl.
CPC ........ *H03K 17/687* (2013.01); *H01L 31/02021* (2013.01); *H02S 50/10* (2014.12); *H03K 17/163* (2013.01); *Y02E 10/50* (2013.01); *Y10T 307/724* (2015.04)

(58) Field of Classification Search
CPC ............. G01R 31/2605; G01R 31/405; G01R 31/2603; G01R 31/3624; G05F 1/67
USPC ......... 324/96, 501, 541, 544, 760.01, 762.01; 136/243–265
See application file for complete search history.

(56) References Cited

U.S. PATENT DOCUMENTS

| 4,382,224 | A |   | 5/1983 | Miller |
|---|---|---|---|---|
| 4,456,880 | A | * | 6/1984 | Warner et al. ............ 324/761.01 |
| 4,528,503 | A |   | 7/1985 | Cole |

(Continued)

FOREIGN PATENT DOCUMENTS

| EP | 0 679 898 A2 |   | 11/1995 |
|---|---|---|---|
| EP | 0 679 898 A3 |   | 7/1996 |
| FR | 2912848 A1 | * | 8/2008 |

OTHER PUBLICATIONS

Examination Report issued by European Patent Office for corresponding European application 10 771 418.0 dated Apr. 7, 2015.

*Primary Examiner* — Tung X Nguyen
*Assistant Examiner* — Adam Clarke
(74) *Attorney, Agent, or Firm* — Frommer Lawrence & Haug LLP

(57) ABSTRACT

Photovoltaic device comprising a photovoltaic generator comprising a number of photovoltaic cells, characterized in that it comprises at least one switch with a control device comprising a control capacitor (Ccde) and a control resistor (Rcde), linked to the switch so as to slow down the control of the opening of the switch, to allow at least one cell of the photovoltaic generator to switch from a short-circuit operating mode to an open-circuit mode, or vice versa.

13 Claims, 6 Drawing Sheets

(56) References Cited

U.S. PATENT DOCUMENTS

| | | | |
|---|---|---|---|
| 4,970,420 A | 11/1990 | Billings | |
| 5,444,358 A * | 8/1995 | Delepaut | 323/222 |
| 6,339,538 B1 * | 1/2002 | Handleman | 363/95 |
| 7,309,850 B2 * | 12/2007 | Sinton et al. | 250/203.4 |
| 2004/0264225 A1 * | 12/2004 | Bhavaraju et al. | 363/120 |
| 2006/0164065 A1 * | 7/2006 | Hoouk et al. | 324/76.17 |
| 2008/0198523 A1 | 8/2008 | Schmidt et al. | |
| 2009/0146667 A1 * | 6/2009 | Adest et al. | 324/537 |
| 2010/0106339 A1 * | 4/2010 | Little et al. | 700/293 |
| 2010/0164459 A1 * | 7/2010 | Perichon et al. | 323/284 |
| 2010/0176773 A1 * | 7/2010 | Capel | 323/266 |
| 2011/0109346 A1 * | 5/2011 | Moussaoui et al. | 327/60 |
| 2011/0298442 A1 * | 12/2011 | Waltisperger et al. | 323/299 |
| 2011/0301772 A1 * | 12/2011 | Zuercher et al. | 700/293 |

\* cited by examiner

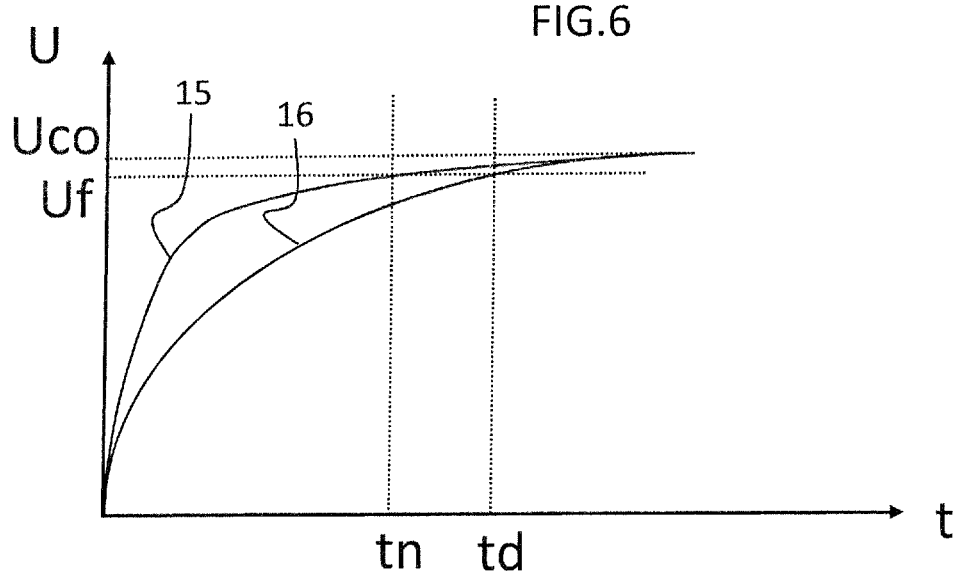
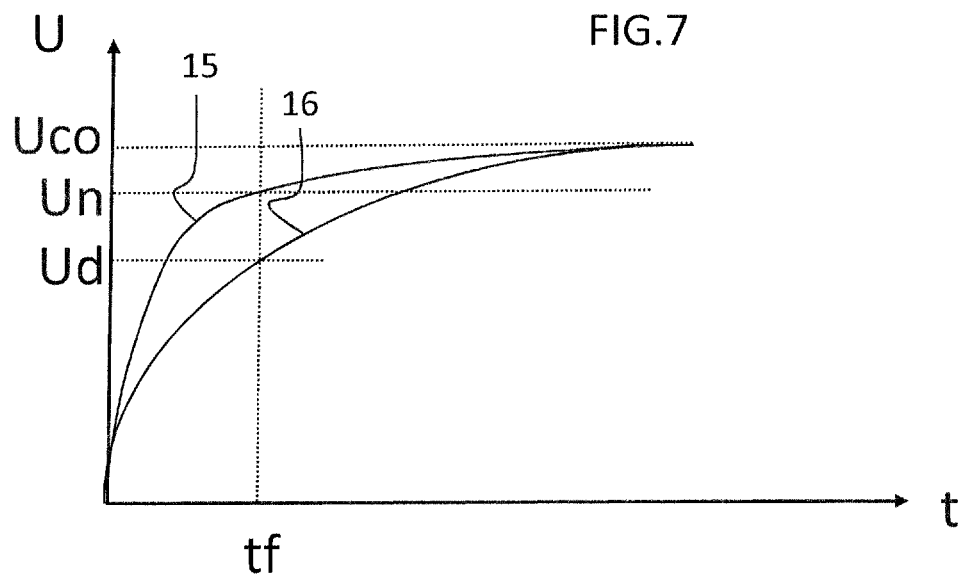

I claim:

PHOTOVOLTAIC DEVICE WITH ELECTRONIC SWITCH(ES)

This application is a 371 of PCT/EP2010/065762 filed on Oct. 20, 2010, published on Apr. 28, 2011 under publication number WO 2011/048122, which claims priority benefits from French Patent Application Number 09/57450 filed Oct. 23, 2009, the disclosure of which is incorporated herein by reference.

The invention relates to a photovoltaic device comprising an electronic switch and a control device. It also relates to a diagnostic method for such a photovoltaic device enabling malfunction thereof to be detected.

It is known practice to use an electronic switch of MOSFET transistor type, as represented in FIG. 1. To control the closure of such a switch, a potential difference exceeding a threshold value Vgs is applied between the gate G and the source S. For this, a voltage Vcde is generally applied by a step whose edge is very short, of the order of a few nanoseconds (ns). It is used to charge the gate capacitor Cg, which is an intrinsic characteristic of the component used, through a resistor Rg of the order of a hundred or so Ohms, according to the electrical circuit diagram represented in FIG. 2. In general, the threshold voltage Vgs is between 12 and 20 V and the voltage Vcde is a pulsed voltage whose edges vary from 0 to a value between 12 and 22 V, in a few ns. Beyond the threshold voltage Vgs, the gate capacitor Cg makes it possible to create a current circulation between G and S which closes the switch. Below this value, the current does not pass and the switch is open. The values of the resistor Rg and of the capacitor Cg determine the switching speed of the switch, for a given voltage control. In the prior art, the above considerations make it possible to achieve an opening of a switch within a duration of approximately 10 ns. The existing solutions for controlling this opening are designed to reduce the switching time in order to reduce the losses by energy dissipation. Now, for certain applications, notably in the field of photovoltaic devices, these existing controls for the opening of switches are not suitable.

Thus, one general object of the invention is to propose a different solution for controlling the opening of a switch in a photovoltaic device.

To this end, the invention relies on a photovoltaic device comprising a photovoltaic generator comprising a number of photovoltaic cells, characterized in that it comprises at least one switch with a control device comprising a control capacitor (Ccde) and a control resistor (Rcde), linked to the switch so as to slow down the control of the opening of the switch, to allow at least one cell of the photovoltaic generator to switch from a short-circuit operating mode to an open-circuit mode, or vice versa.

The invention is more specifically defined by the claims.

These objects, features and advantages of the present invention will be explained in detail in the following description of a particular embodiment, given as a nonlimiting example in relation to the appended figures in which.

Figure 1:
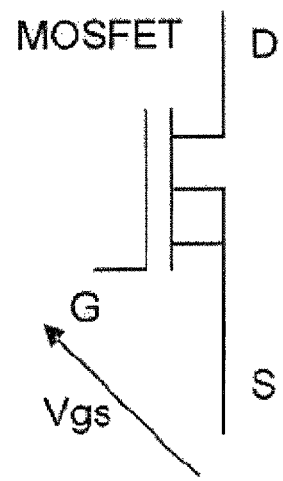
FIG. 1 represents a switch of MOSFET transistor type according to the prior art.
Figure 2:
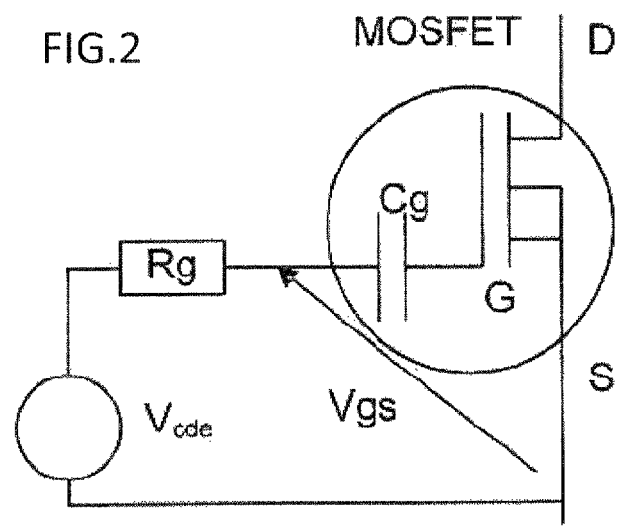
FIG. 2 represents the control of the opening of a switch of MOSFET type according to the prior art.
Figure 3:
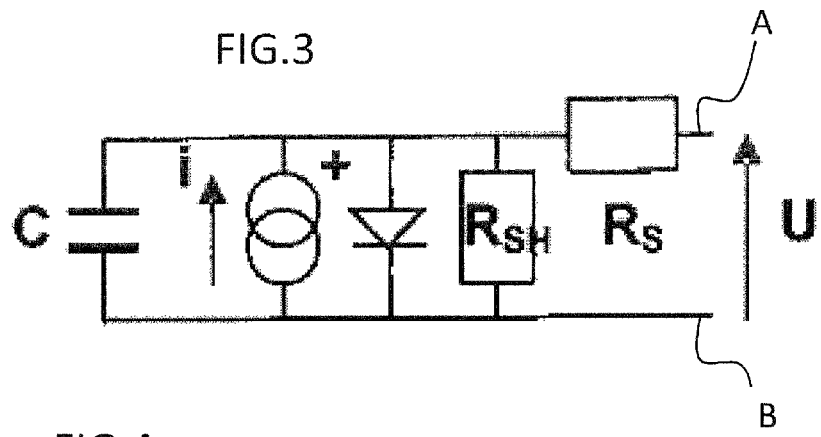

FIG. 3 schematically illustrates an electrical circuit diagram equivalent to a photovoltaic cell.

Figure 4:
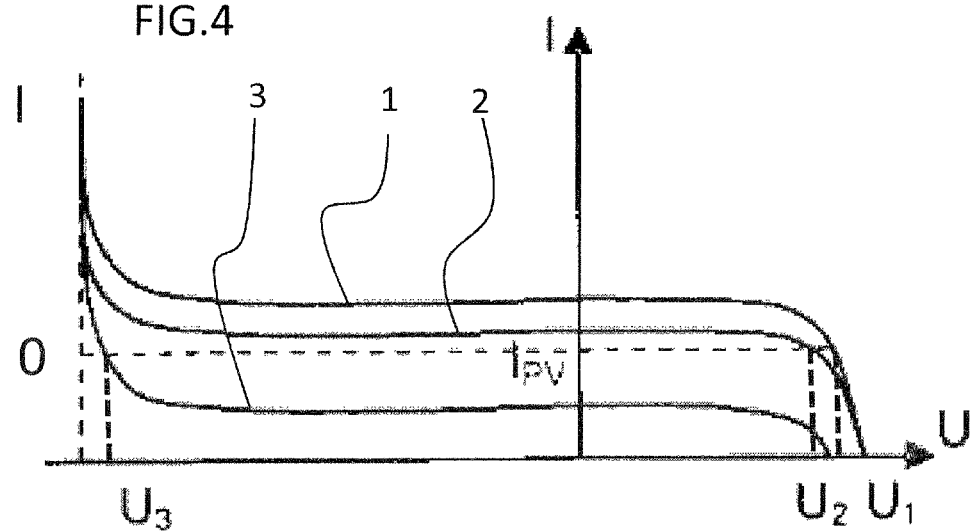

FIG. 4 represents the voltage-current curve obtained at the terminals of different photovoltaic cells.

Figure 5:
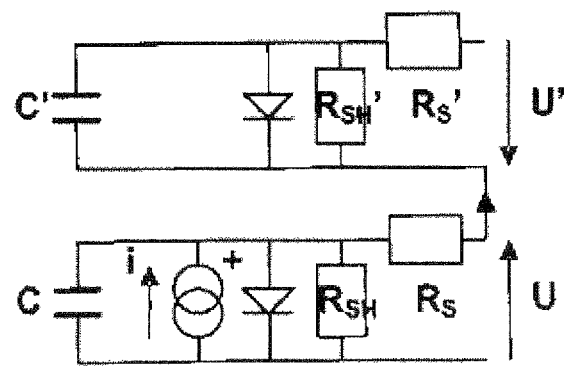

FIG. 5 schematically represents the electrical circuit of two photovoltaic cells in series, one of which is defective.

FIGS. 6 and 7 respectively represent two different diagnostic methods for a photovoltaic generator based on curves of the trend of the voltage as a function of time at the terminals of a normal and defective photovoltaic generator.

Figure 8:
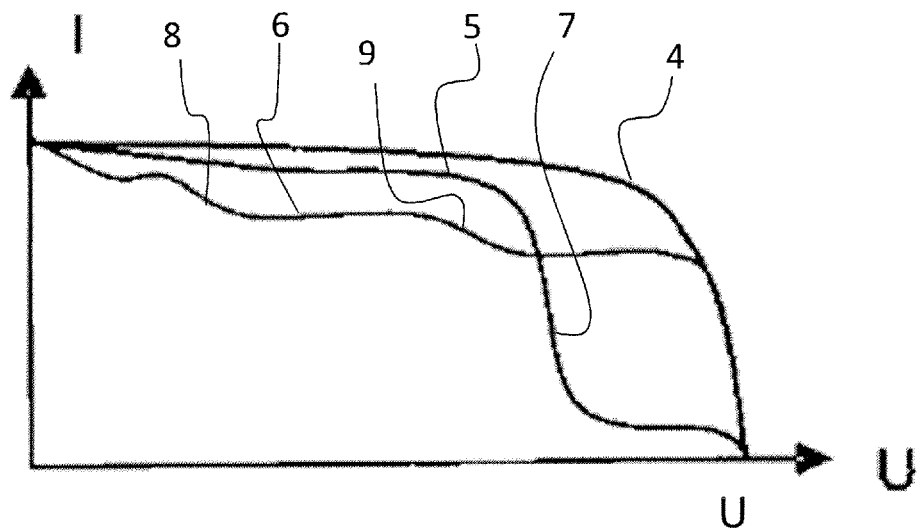

FIG. 8 represents the voltage-current curves obtained at the terminals of a photovoltaic generator according to different scenarios.

Figure 9:
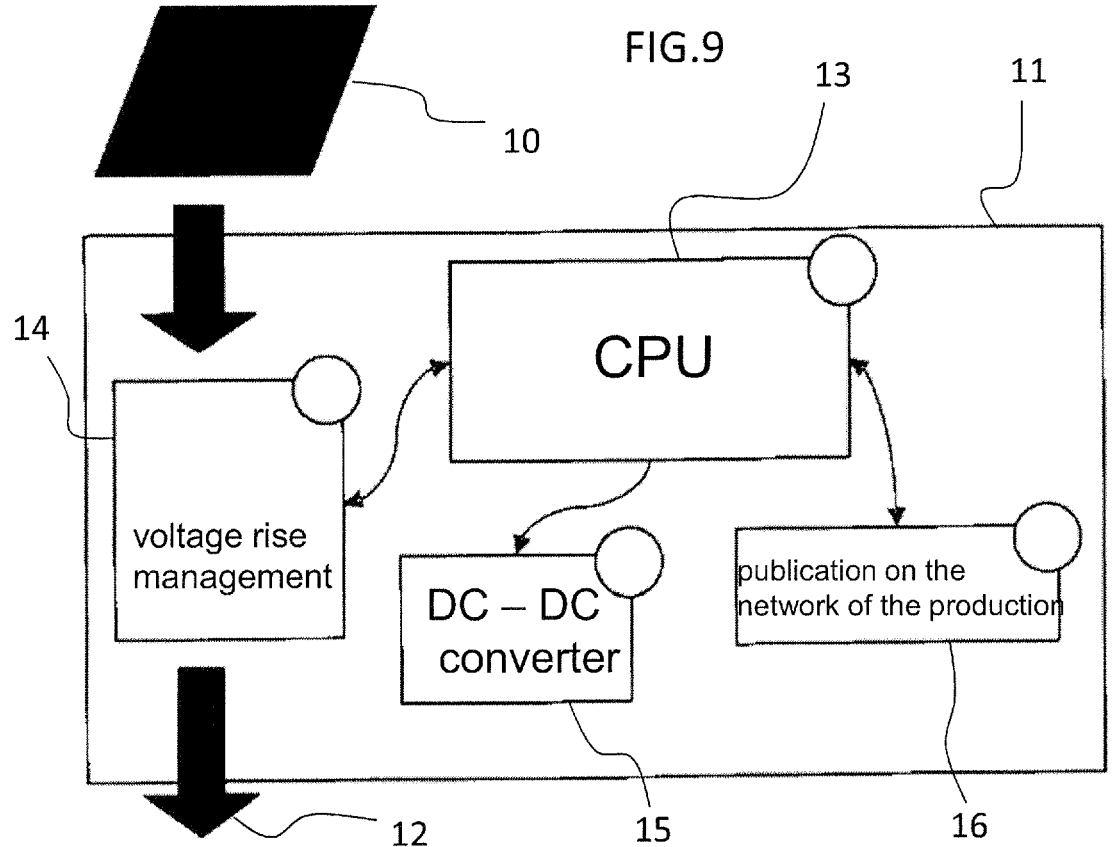

FIG. 9 illustrates a photovoltaic device according to one embodiment of the invention.

Figure 10:
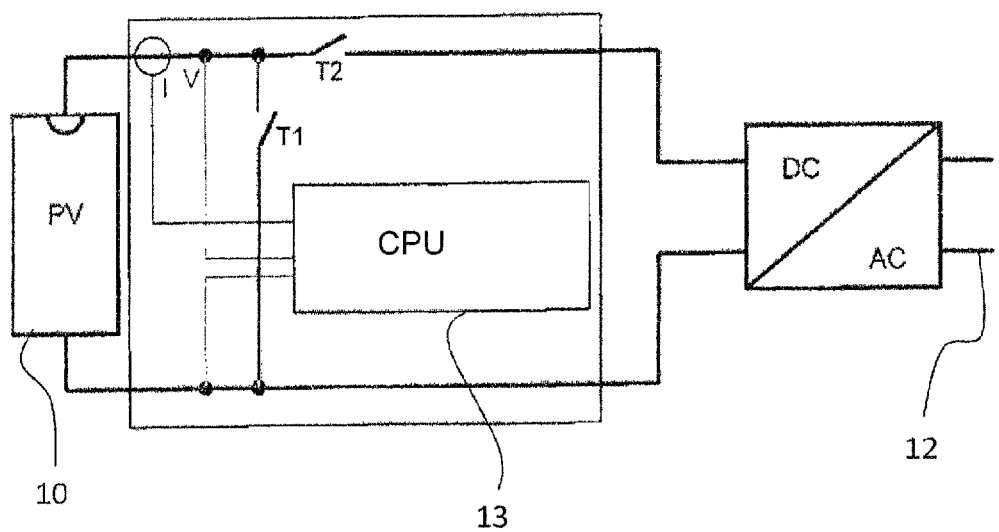

FIG. 10 represents the electrical circuit implemented for diagnosing the photovoltaic device according to the embodiment of the invention.

Figure 11:
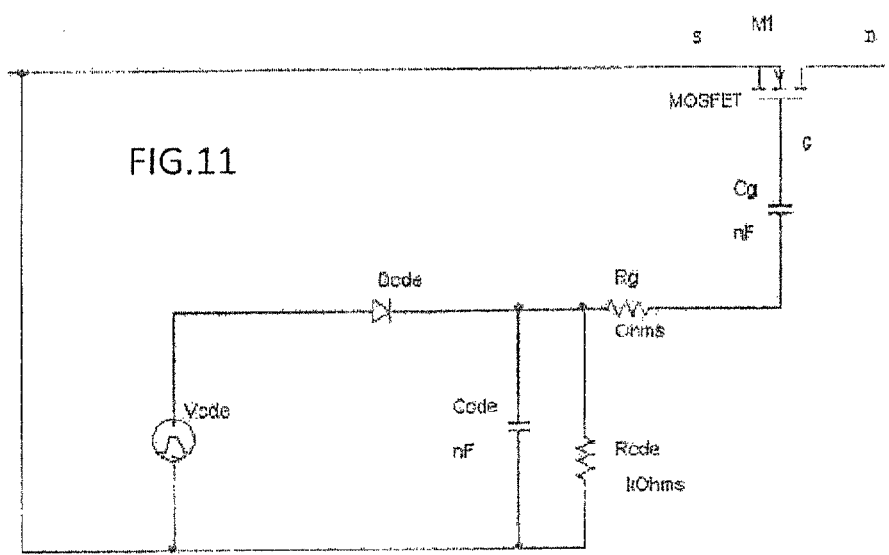

FIG. 11 represents the electrical circuit implemented for the control of a switch according to one embodiment of the invention.

Figure 12:
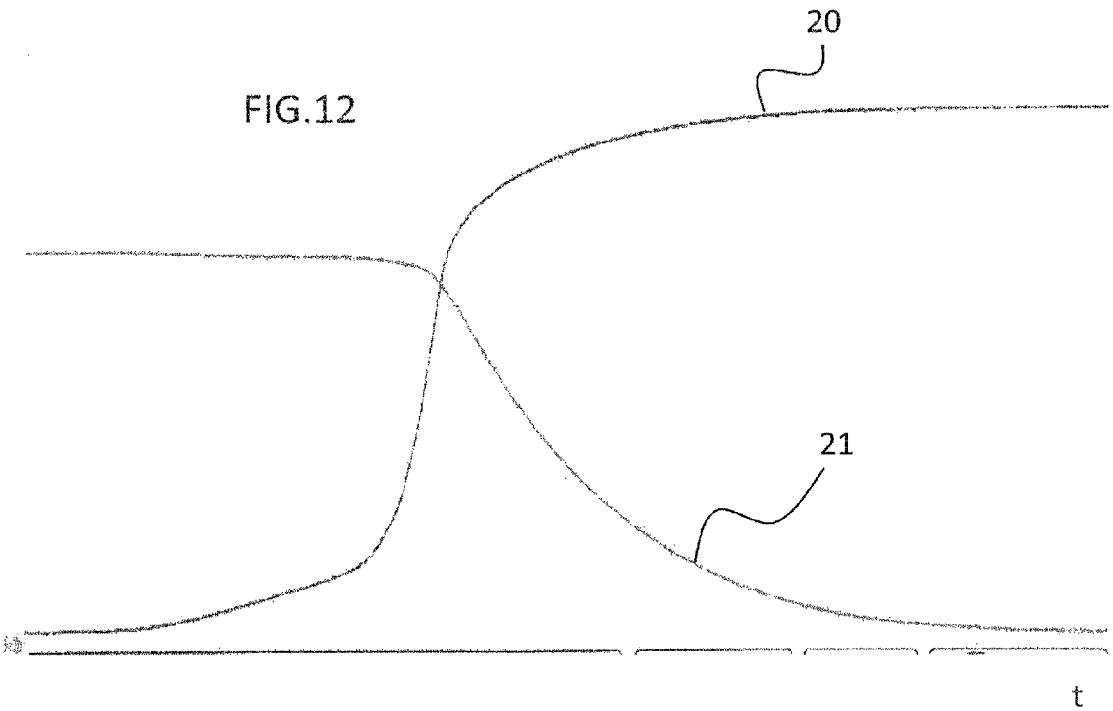

FIG. 12 represents the trends of the voltage and current during an opening of a switch controlled according to the embodiment of the invention.

Figure 13:
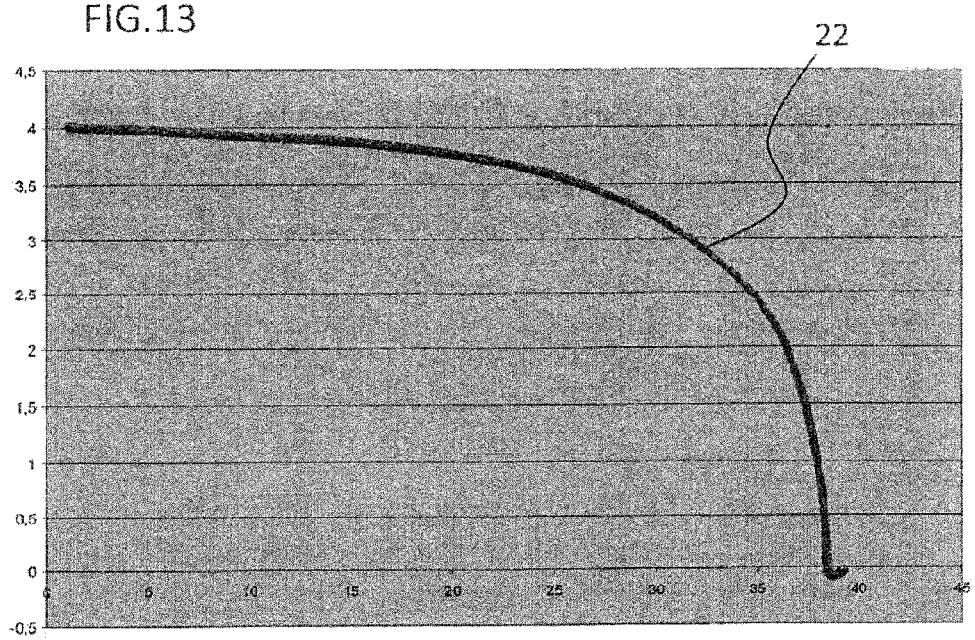

FIG. 13 represents the U(I) curve at the terminals of a photovoltaic module obtained by an imperfect measurement following a non-optimization of the control of the switch.

The devices for generating energy from intermittent sources, such as photovoltaic generators, are increasingly being used. The cost of their production depends on their autonomy and on their capacity to diagnose their failure, if possible in real time. The existing devices are not designed for a fast reaction in case of failure, even when their production becomes abnormally low. For this reason, they require complex and costly maintenance operations.

Photovoltaic devices are conventionally managed by observing their behaviour in systems linked to these devices, for example by measuring the charge of a battery linked to the device or by measuring the electricity production obtained on an electricity network to which the device is linked. In case of a measurement lower than the expected value, it is concluded that the photovoltaic device has failed. Such conventional management presents the drawback of being imprecise. This is because it does not make a distinction between a normal drop in production caused by shadows or particular weather conditions and a real failure of the device. Furthermore, it does not make it possible to differentiate different failures of the device such as an increase in the resistance of the wiring, for example following a connection system fault or an electrical arc in the device, or a deterioration of the front panel of a photovoltaic generator, for example following delamination or corrosion, shading or soiling.

One solution relies on the analysis of the trend of the voltage of a photovoltaic during its switch from a short-circuit operating mode to an open-circuit operating mode, or vice versa. This trend can be observed by the curve of the voltage as a function of time or by analyzing the curve representing the current as a function of the voltage in the photovoltaic generator during this change of mode.

The switch from short-circuit operation to an open-circuit operating mode requires a particular control of a switch, whose opening time must be sufficiently slow to allow for numerous points of voltage and/or current values to be measured, slower than the usual duration, and sufficiently fast so as not to disturb the inverter and the rest of the electricity network to which the photovoltaic device is linked.

Thus, the invention relies on a switch equipped with a control device which makes it possible to achieve an opening time which represents a good trade-off to respond to the above constraints. Its implementation in a photovoltaic device makes it possible to detect its failure, according to the principle explained above.

In the preamble to the description of an embodiment of the control device of a switch used by the invention, the principle of detection of the failure of a photovoltaic device will be detailed below.

A photovoltaic cell behaves according to an electrical circuit as represented schematically in FIG. 3. It supplies a current I and a voltage U on its output terminals AB.

FIG. 4 represents the curve of current I as a function of voltage U obtained at the terminals of different photovoltaic cells. The curves 1 and 2 illustrate the case of photovoltaic cells in normal operation, that is to say non-defective. The curve 3 illustrates the situation of a photovoltaic cell receiving insufficient or zero irradiation, called defective cell. In the case where the current supplied by a photovoltaic generator, which comprises a number of these photovoltaic cells, rises to a value $I_{PV}$, the photovoltaic cells in the normal operating position will exhibit a positive voltage U1, U2 at their terminals whereas a defective cell will exhibit a negative voltage U3.

FIG. 5 schematically illustrates the electrical representation of a cell in normal operation placed in series with a defective cell, whose voltage U' is opposite to the voltage U of the cell in normal operating state. In a defective photovoltaic cell, its capacitor C' is charged negatively, its opposite voltage can reach more than 20 times the value of the nominal voltage of the cell and its maximum current is lower than that of another cell. In the case of the opening of the circuit linked to such a defective cell, the voltage of the defective cell will take a much longer time than that of a normal cell to reach a positive nominal value. This time may be of the order of 20 to 100 times longer.

Thus, the above phenomenon is exploited to create, depending on the response of a photovoltaic generator during its switch from a short-circuit mode to an open-circuit mode, a diagnosis of its operation.

FIGS. 6 and 7 represent curves 15, 16 of the trend of the voltage U as a function of time t at the terminals of a photovoltaic generator in its switch from short-circuit to open-circuit, respectively in the case of normal operation and in the case of defective operation. The normal curve 15 shows that the voltage U finally converges towards a maximum voltage $U_{CO}$. The curve 16 shows that the voltage of a defective generator increases much less quickly.

Thus, a first method for diagnosing the state of the photovoltaic generator, represented in FIG. 6, consists in observing the time needed to reach a voltage Uf representing a predefined percentage of the maximum voltage $U_{CO}$, for example 95%. In the case of the generator in normal operation, the predefined final value Uf is reached after a normal time tn. In the case of the defective generator, the predefined final value Uf is reached after a longer time td. Thus, the comparison of the times td and to makes it possible to diagnose the state of the photovoltaic generator.

A second method, represented in FIG. 7, consists in measuring the voltage obtained for a predefined time tf. In the case of the generator in normal operation, a normal value Un is reached after the time tf. In the case of the defective generator, a lower final value Ud is reached after the time tf. Thus, the comparison of the voltages Un and Ud enables the state of the photovoltaic generator to be diagnosed.

FIG. 8 illustrates three U(I) curves 4, 5, 6 obtained respectively according to three different scenarios when a photovoltaic generator switches from a short-circuit situation to an open-circuit situation. Each U(I) curve is the sum of the U(I) curves of each of the photovoltaic cells that make up the photovoltaic generator. Equivalent curves would be obtained for a switch from an open-circuit circuit to a short-circuit situation.

Curve 4 represents a photovoltaic generator in which all the photovoltaic cells are in a good operating state. When the circuit is opened, the current will reach a zero value whereas the voltage will reach a maximum value $U_{CO}$ after a relatively short time. The curve 5 represents the same curve obtained in the case of a generator comprising at least one defective photovoltaic cell. This curve exhibits a discontinuity 7 during which the current drops more rapidly whereas the voltage increases little. The curve 6 illustrates another example in which the curve exhibits two discontinuities 8, 9, which indicate the presence of at least two defective photovoltaic cells. In all cases, the same voltage value $U_{CO}$ is finally reached, but after a much longer time in the case of the curves 5, 6 for the generators having at least one defective cell as was explained above. These examples make it possible to illustrate a number of situations and teach that the U(I) curves make it possible to obtain the following diagnoses:

there are as many defects in the device as there are discontinuities 7, 8, 9;

the greater the discontinuity, the more significant the failure.

The above explanations will be used in an embodiment of a photovoltaic device equipped with a device allowing its operation to be diagnosed, represented in FIG. 9.

The photovoltaic device of FIG. 9 comprises a photovoltaic generator 10, which may comprise one or more photovoltaic cells, linked to the electricity network by a link 12 via an inverter 11. This inverter is managed by a microcontroller or CPU 13, whose main function is to determine the operating point of the photovoltaic generator 10 and its link with the network 12. For this, it is in contact with a voltage step-up management block 14, a DC-DC converter 17, and a block 18 for managing the publication of the production on the network. To fulfil its function, the CPU 13 regularly orders the following measurements:

voltage and current supplied by the DC panel;
measurement of insulation on the DC side;
measurement of network presence;
current and voltage injected onto the AC network.

The photovoltaic device also comprises a diagnostic device incorporated in the inverter 11 described above, whose CPU implements the diagnostic method for the photovoltaic generator and in particular the method for detecting failures, which will be described later. The diagnostic device corresponds to the electrical circuit diagram represented in FIG. 10. The CPU 13 of the inverter receives the measurements of the current I and of the voltage V from the photovoltaic generator 10 and controls two switches T1, T2 according to the invention, the control function of which will be detailed later. In the normal operating situation of electricity production, the switch T2 is closed whereas the switch T1 is open. As a variant, other devices are possible, notably relying on at least one switch. As a variant, the diagnostic device could be incorporated into any other module distinct from the inverter, such as a module positioned at the level of at least one photovoltaic cell for example. According to a variant embodiment, such a module could incorporate other functions, such as a function for detecting electrical arcs within the photovoltaic generator. Thus, the failure detection method is implemented by software installed on a microcontroller or any medium, which is then incorporated in the photovoltaic device, and operates on the basis of the reception of measurements in phase with the control of the switch(es).

Such a device can make it possible to implement the method for diagnosing it according to a first embodiment comprising the following steps:

opening of the switch T2 to cause the photovoltaic generator to switch from a closed-circuit mode to an open-circuit mode;

measurement of the stabilized maximum voltage $U_{CO}$, obtained at the terminals of the photovoltaic generator after a certain time (stabilization time), when the current is zero;

closure of the switch T1 to set the photovoltaic generator to short-circuit mode then opening of the switch T1 to reset it to open-circuit mode;

measurement of the voltage U at the terminals of the photovoltaic generator obtained after a predefined time t. In this embodiment, t is chosen to be equal to 15 microseconds. Any value relatively close to the time needed for the generator in a non-defective operating situation to reach a predefined percentage of the stabilized maximum voltage $U_{CO}$ may be suitable, this time being either measured, or estimated. The predefined time t will therefore be sufficiently great for the voltage to converge towards the maximum voltage $U_{CO}$ of the generator, at least for the case of a non-defective generator. Thus, more generally, a value between $10^{-7}$ and $10^{-2}$ seconds could be chosen for this predefined time;

comparison of the measured voltage U with the predefined percentage of the maximum voltage $U_{CO}$:

if the measured voltage U reaches a certain predefined percentage of the maximum voltage $U_{CO}$, then the generator is considered to be operating normally and the switch T2 is closed to reset the generator to its normal electricity production situation. The predefined percentage is set at 95% in this embodiment. It could take other values, because it depends on the predefined time t, and, for example, could take any value preferably greater than 50%;

if the measured voltage U does not reach the predefined percentage of the maximum voltage $U_{CO}$ then the generator is considered to be defective.

As a variant, it is possible to observe the voltage-current curve U(I) determined while the device switches from a short-circuit operating mode to an open-circuit mode. For this, the following steps are carried out:

closure of the switch T1 to reset the photovoltaic generator to short-circuit mode then opening of the switch T1 to reset it to open-circuit mode;

measurement of a number of points of voltage and of current according to a predefined frequency $f_{acq}$, this frequency advantageously being located between 100 kHz and 1 MHz;

when the voltage reaches the value $U_{CO}$, then the switch T2 is closed to reset the generator to its normal electricity production situation;

the points measured are transmitted and analyzed by the CPU 13 of the photovoltaic device, which can thus deduce the number of defects and the significance of the degradation.

According to a variant embodiment in reciprocal mode, only the first step is modified; the switch T1 is first of all opened then closed so as to generate a switch from an open-circuit to a short-circuit.

As a variant, the two embodiments described previously may be aggregated. For example, the first embodiment relying on the analysis of the trend as a function of time of the voltage when it switches from a short-circuit operating mode to an open-circuit operating mode may be followed, in the case where a defect is detected, by the determination and the observation of the trend of the curve U(I) in order to deduce therefrom additional information concerning the defects of the device.

According to the invention, the time needed to implement the diagnosis is sufficiently short to allow it to be executed without completely stopping the inverter 11, which would then require a significant time in the contrary case possibly as long as a few minutes, to once again produce its maximum power. For this, it should be noted that the inverter comprises a capacitive bus that allows energy to be stored. So as not to disturb its operation, the U(I) curve should be plotted in less than 10 ms. However, the usual opening time of a switch of 10 ns is too fast to allow for a satisfactory number of measurements and to plot a satisfactory U(I) curve. Thus, the invention proposes slowing down the opening of such a switch by virtue of a particular control device to achieve an opening in a time of between 10 ns and 10 ms.

FIG. 11 represents the control device of a switch according to one embodiment of the invention. This device relies on the addition of a resistor Rcde, whose function is to increase the duration of the discharging of the gate capacitor Cg of the transistor, a capacitor Ccde, whose function is to slow down the drop in the control voltage, and a diode Dcde, whose function is to prevent the discharging of the gate capacitor Cg towards the voltage generator Vcde. The control capacitor (Ccde) and the control resistor (Rcde) are arranged in parallel and linked to the input terminal of the assembly formed by the gate resistor (Rg) and the gate capacitor (Cg).

As an example, consider a voltage in rising and falling pulses varying between 0 and 17 V in a few ns. On direct command to open the transistor, via the diode Dcde, the value of the control voltage Vcde switches to 0 V. The control capacitor Ccde, whose value is 220 nF, slowly discharges through the control resistor Rcde, whose value is 12 kOhms. At the same time, the capacitor Cg of the transistor discharges just as slowly, the diode preventing a possible discharge by the voltage supply Vcde. Note, this diode is optional. To use this device with a polycrystalline silicon photovoltaic module, the opening time is 800 µs. During this opening, the device measures a hundred or so points, preferably at least 10 points, making it possible to plot the curves 20 of the trend of the voltage and 21 of the trend of the current, during these 800 µs of opening time, represented in FIG. 12. These measurements thus make it possible to obtain an accurate U(I) curve, similar to the curve 4 of FIG. 8.

Naturally, the above numerical values are given by way of example, and they should be adapted to the switch and photovoltaic module technologies used, for which the capacitors vary from one technology to another, thereby influencing the shape of the U(I) curves. Thus, it is a good idea to slow down even more the switching of the switches associated with a module whose stray capacitance is high. For this, the values of the capacitors Ccde and of the control resistor Rcde, which determine the level of slowdown in the opening of the switch with which these components are associated, will be adapted to the photovoltaic modules to be equipped, based on particular tests performed previously on these modules. The greater the value of the control capacitance, the longer the switching time and the more accurate the U(I) curve obtained. Advantageously the control capacitor Ccde will have a value of between 10 and 10000 nF and the control resistor Rcde will have a value greater than 1 kOhm. FIG. 13 represents, by way of example, an imperfect U(I) curve obtained in the case of a non-optimal parameter setting of the components of the switch control device, in which the zone 22 corresponding to the maximum power point is much less marked. Thus, it is best notably to choose the Rcde and Ccde parameters of the control device of the switch so as to obtain a precise bend in the U(I) curve. In practice, these values will be determined according to the desired slowdown of the switching and will be such that they have the effect of obtaining an opening between 10 ns and 10 ms, a value between 1 and 5000 μs being advantageous. They may be determined empirically to be adapted perfectly to the environment and to the switch to which the slowdown control will be applied.

A diagnostic method for the photovoltaic device has been described as an example. Obviously, other variants are possible for this diagnosis, relying on the variation of the time needed to reach the maximum voltage $U_{CO}$ at the terminals of the generator in an open-circuit situation. This maximum voltage is not necessarily measured each time the diagnostic method is implemented, but it may, for example, be measured just once when the generator is new, in normal, non-defective operation, and stored. Similarly, the time needed to reach this value may be measured simultaneously, and stored to serve as a base for the diagnostic steps.

Thus, a possible variant of the first embodiment of the diagnostic method of the generator may consist in systematically waiting, while the generator switches to open-circuit mode, for the voltage to reach the maximum voltage, measuring the time needed and comparing it to the normal time in case of correct operation. If this time exceeds the normal time by a predefined percentage, then the generator is considered to be defective.

The diagnostic method has been described on the basis of a diagnostic device corresponding to the electrical circuit diagram represented in FIG. 10. According to an advantageous variant, the diagnosis could be made by using the input structure of a photovoltaic inverter. Conventionally, these inverters use power electronic components, either in series, or in parallel, or both, that can make it possible to disconnect the inverter part (DC/AC converter stage) from the chopper part (DC/DC converter stage) of the "photovoltaic inverter" appliance and/or to produce the DC/DC conversion function. These components may perform the switch from short-circuit to open-circuit of the photovoltaic generator(s) connected to the input and thus make it possible to make the diagnosis. This functionality could also be implemented easily and primarily by virtue of software adaptations to the existing inverters.

As an additional note, the usual objective of a photovoltaic device is to produce electrical energy by reducing the losses of the system to the maximum, and therefore by using fast switching modes in the DC/DC or DC/AC converters mentioned above for the power conversion. Furthermore, the measurement devices currently used are not active but passive, that is to say that they do not intervene on the direct operation of the photovoltaic device. On the contrary, the photovoltaic device of the invention incorporates an active part, which will directly modify its operation. Furthermore, this active intervention is designed to be sufficiently slow to achieve a meaningful measurement of the trend of the voltage as a function of time in the situations described previously, but also sufficiently fast so as not to disturb the rest of the electricity network. Following the explanations given previously, those skilled in the art will be able to choose the parameters that determine this measurement time. Advantageously, they will choose them to achieve a total duration of the measurement, or the plot of the trend of the voltage as a function of time or of current, between 0.5 and 1 ms.

The invention claimed is:

1. Photovoltaic device comprising
a photovoltaic generator comprising a number of photovoltaic cells, wherein the photovoltaic generator comprises a first switch (T1) disposed in parallel on a branch between two terminals of at least one cell of the photovoltaic generator, and
a control device linked to the first switch comprising a control capacitor (Ccde) and a control resistor (Rcde) so as to slow down the control of the opening of the first switch, to allow at least one cell of the photovoltaic generator to switch from a short-circuit operating mode to an open-circuit operating mode, or vice versa;
at least one control switch that is an MOS transistor, comprising a gate capacitor (Cg) and a gate resistor (Rg) in series, the control capacitor (Ccde) and the control resistor (Rcde) being arranged in parallel at the input terminal of the assembly formed by the gate resistor (Rg) and the gate capacitor (Cg),
wherein the control device also comprises a diode (Dcde), arranged to prevent discharge of the gate capacitor (Cg) to a voltage generator (Vcde) which would be arranged at the terminals of the assembly formed by the control capacitor (Ccde) and the control resistor (Rcde) to transmit a voltage command to the control switch.

2. Photovoltaic device according to claim 1, wherein at least one second switch (T2) that links or does not link the photovoltaic generator to an external load based on an output voltage of the photovoltaic generator.

3. Photovoltaic device according to claim 1, wherein the control capacitor (Ccde) has a value between 10 and 10000 nF and the control resistor (Rcde) has a value greater than 1 kOhm.

4. Photovoltaic device according to claim 1, wherein the control capacitor (Ccde) and the control resistor (Rcde) have values capable of slowing down the opening of the first switch to achieve its opening between 10 ns and 10 ms.

5. Photovoltaic device according to claim 4, wherein the control capacitor (Ccde) and the control resistor (Rcde) have values capable of slowing down the opening of the first switch to achieve its opening between 1 and 5000 μs.

6. Diagnostic method for a photovoltaic device according to claim 1, wherein the method implements a step of closing of a first switch (T1) linked to the two terminals of the photovoltaic generator so as to place the photovoltaic generator in a short-circuit operating mode, and comprises a step of observing the trend of the photovoltaic generator voltage (U) while the photovoltaic generator switches from the short-circuit operating mode to an open-circuit operating mode using a control device of said first switch, or vice versa from the open-circuit operating mode to the short-circuit operating mode.

7. Diagnostic method for a photovoltaic generator according to claim 6, wherein the method comprises measurement of points of photovoltaic generator voltage (U) and/or of photovoltaic generator current (I) during the switch from the short-circuit operating mode to the open-circuit mode or vice versa within a duration of between 500 μs and 1 ms.

8. Diagnostic method for a photovoltaic device according to claim 6, wherein the photovoltaic device comprising the steps of:
closing a first switch (T1) disposed in parallel on a branch between the two terminals of the photovoltaic generator to set the photovoltaic generator to the short circuit operating mode; and
opening the first switch (T1) and a second switch (T2), the second switch disposed on a branch arranged between one terminal of the photovoltaic generator and an output terminal of the photovoltaic device to set the photovoltaic generator to the open-circuit operating mode, controlling the opening and closing of the first switch with at least one control switch that is an MOS transistor, the control switch comprising a gate capacitor (Cg) and a gate resistor (Rg) in series, the control capacitor (Ccde) and the control resistor (Rcde) being arranged in parallel at the input terminal of the assembly formed by the gate resistor (Rg) and the gate capacitor (Cg), wherein the controlling step also comprises a diode (Dcde) arranged to prevent discharge of the gate capacitor (Cg) to a voltage generator (Vcde) which would be arranged at the terminals of the assembly formed by the control capacitor (Ccde) and the control resistor (Rcde) to transmit a voltage command to the control switch.

9. Diagnostic method for a photovoltaic generator according to claim 6, wherein the step of observing the trend of the photovoltaic generator voltage (U) comprises observation of the trend U(I) of the photovoltaic generator voltage (U) as a function of photovoltaic generator current (I).

10. Diagnostic method for a photovoltaic generator according to claim 9, wherein the method comprises measurement of at least 10 points of photovoltaic generator voltage (U) and/or of photovoltaic generator current (I) during the switch from the short-circuit operating mode to the open-circuit mode or vice versa within a time of between 10 ns and 10 ms.

11. Diagnostic method for a photovoltaic generator according to claim 9, wherein the method comprises a step of detecting discontinuities in a voltage-current curve to deduce therefrom a number of defects and a significance of a failing.

12. Diagnostic method for a photovoltaic generator according to claim 9, wherein the method comprises the following additional steps:

opening of a second switch (T2) in order to switch the photovoltaic generator from a closed-circuit position to an open-circuit position, by disconnecting the photovoltaic generator from a load;

measuring a stabilized maximum voltage ($U_{CO}$) obtained at terminals of the photovoltaic generator; closing of a first switch (T1) to set the photovoltaic generator to the short-circuit operating mode;

opening of the first switch (T1) to reset the photovoltaic generator to the open-circuit operating mode;

measuring a voltage (U) and of a current (1) at the terminals of the photovoltaic generator until the voltage (U) reaches the maximum voltage ($U_{CO}$) to obtain the voltage-current curve U(I);

closing the second switch (T2) to reset the photovoltaic generator to a normal electrical production condition linked with the load.

13. Photovoltaic device comprising a photovoltaic generator comprising a number of photovoltaic cells, wherein the photovoltaic generator comprises a first switch (T1) in parallel on at least one cell of the photovoltaic generator, and a control device linked to the first switch, the control device comprising a control capacitor (Ccde) and a control resistor (Rcde) so as to slow down the control of the opening of the first switch, to allow at least one cell of the photovoltaic generator to switch from a short-circuit operating mode to an open-circuit mode, or vice versa, the control capacitor (Ccde) and the control resistor (Rcde) having values capable of slowing down the opening of the switch to achieve opening of the first switch between 10 ns and 10 ms, wherein the control device includes at least one control switch that is an MOS transistor, comprising a gate capacitor (Cg) and a gate resistor (Rg) in series, the control capacitor (Ccde) and the control resistor (Rcde) being arranged in parallel at the input terminal of the assembly formed by the gate resistor (Rg) and the gate capacitor (Cg), wherein the control device also comprises a diode (Dcde), arranged to prevent discharge of the gate capacitor (Cg) to a voltage generator (Vcde) which would be arranged at the terminals of the assembly formed by the control capacitor (Ccde) and the control resistor (Rcde) to transmit a voltage command to the control switch.

\* \* \* \* \*